United States Patent [19]
Umotoy et al.

[11] Patent Number: 6,086,677
[45] Date of Patent: Jul. 11, 2000

[54] DUAL GAS FACEPLATE FOR A SHOWERHEAD IN A SEMICONDUCTOR WAFER PROCESSING SYSTEM

[75] Inventors: Salvador P. Umotoy, Antioch; Lawrence C. Lei; Anh N. Nguyen, both of Milpitas; Steve H. Chiao, Fremont, all of Calif.

[73] Assignee: Applied Materials, Inc., Santa Clara, Calif.

[21] Appl. No.: 09/098,969

[22] Filed: Jun. 16, 1998

[51] Int. Cl.[7] .................................................. C23C 16/00
[52] U.S. Cl. ............................ 118/715; 118/724; 118/725
[58] Field of Search ..................................... 118/715–733

[56] References Cited

U.S. PATENT DOCUMENTS

| | | | |
|---|---|---|---|
| 5,453,124 | 9/1995 | Moslehi et al. | 118/715 |
| 5,595,606 | 1/1997 | Fujikawa et al. | 118/725 |
| 5,709,757 | 1/1998 | Hatano et al. | 134/22.14 |
| 5,781,693 | 7/1998 | Ballance et al. | 392/416 |

*Primary Examiner*—Jeff H. Aftergut
*Attorney, Agent, or Firm*—Thomason, Moser & Patterson

[57] ABSTRACT

A faceplate for a showerhead of a semiconductor wafer processing system having a plurality of gas passageways to provide a plurality of gases to the process region without commingling those gases before they reach the process region within a reaction chamber. The showerhead contains faceplate and a gas distribution manifold assembly. The faceplate defines a plurality of first gas holes that carry a first gas from the manifold assembly through the faceplate to the process region and a plurality of channels that couple a plurality of second gas holes to a plenum that is fed the second gas from the manifold assembly.

20 Claims, 6 Drawing Sheets

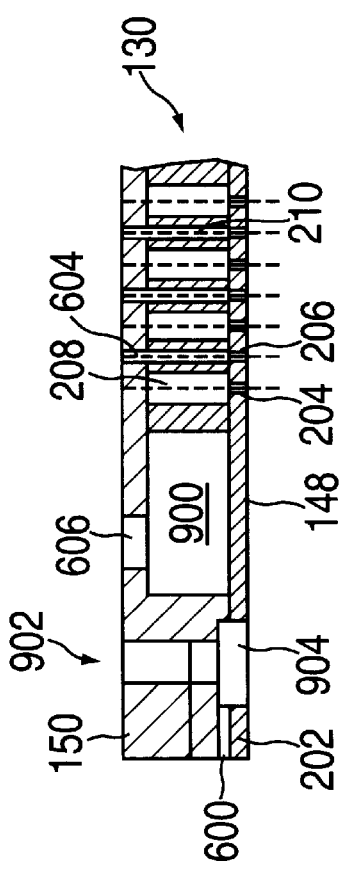
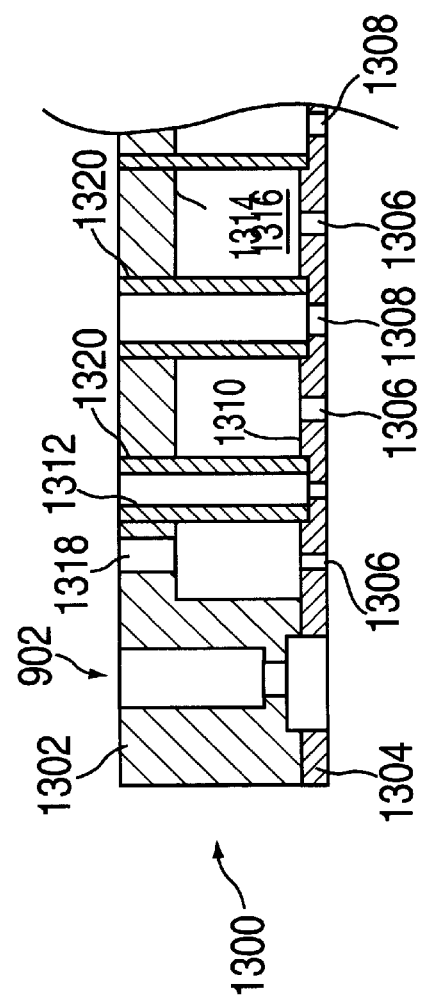

DUAL GAS FACEPLATE FOR A SHOWERHEAD IN A SEMICONDUCTOR WAFER PROCESSING SYSTEM

BACKGROUND OF THE DISCLOSURE

1. Field of the Invention

The present invention relates to semiconductor wafer processing systems and, more particularly, to a gas distribution showerhead for supplying at least two process gases to a reaction chamber of a semiconductor wafer processing system.

2. Description of the Background Art

Semiconductor wafer processing systems generally contain a process chamber having a pedestal for supporting a semiconductor wafer within the chamber proximate a processing region. The chamber forms a vacuum enclosure defining, in part, the process region. A gas distribution assembly or showerhead provides one or more process gases to the process region. The gases are then heated and/or supplied energy to form a plasma which performs certain processes upon the wafer. These processes may include chemical vapor deposition (CVD) to deposit a film upon the wafer or an etch reaction to remove material from the wafer.

In processes that require multiple gases, generally the gases are combined within a mixing chamber that is then coupled to the showerhead via a conduit. For example, in titanium nitride deposition using titanium tetrachloride ($TiCl_4$) and ammonia ($NH_3$) as process gases, the two process gases are supplied to a mixing chamber along with respective carrier gases of helium and hydrogen where they are combined to form a gaseous mixture. The gaseous mixture is then coupled through a conduit to a distribution plate, where the plate contains a plurality of holes such that the gaseous mixture is evenly distributed into the process region. As the gaseous mixture enters the process region and is infused with energy, a chemical reaction occurs between the titanium tetrachloride and the ammonia such that the titanium tetrachloride chemically reacts with the ammonia (i.e., the $TiCl_4$ is reduced by the $NH_3$) to produce titanium nitride. The titanium nitride is deposited on the wafer in a chemical vapor deposition reaction.

Other two gas chemical vapor deposition reactions include the thermal decomposition of tetradiethylaminotitanium (TDEAT) in combination with ammonia to produce titanium nitride, the thermal decomposition of tetradimethylaminotitanium (TDMAT) in combination with ammonia or a nitrogen-hydrogen mixture to produce titanium nitride, or a reduction of tungsten hexafluoride ($WF_6$) using hydrogen ($H_2$) to produce tungsten. In any of these cases and any others that require two or more gases to process a wafer, multiple gases need be uniformly supplied to the process region.

Although it is generally advantageous to mix the gases prior to release into the process region to ensure that the gases are uniformly distributed into the process region, the gases tend to begin reduction, or otherwise react, within the mixing chamber. Consequently, deposition or etching of the mixing chamber, conduits and other chamber components may result prior to the gaseous mixture reaching the process region. Additionally, reaction by products may accumulate in the chamber gas delivery components.

In an effort to maintain the gases in separate passageways until they exit the distribution plate into the process region, U.S. Pat. No. 5,595,606 issued Jan. 21, 1997 (the "'606 patent") discloses a multiple block stack that forms a showerhead that ostensibly maintains two gases in separate passageways until they exit the distribution plate into the process region. As such, the gases do not mix or react with one another until they reach the process region near the wafer.

FIG. 14 depicts a cross sectional view of the prior art showerhead 50 of the '606 patent which includes an upper, a middle and a lower block 58, 60, and 62 having a first set of gas passages 54a, 54b, 54c (collectively, passageway 54) and a second set of gas passages 52a, 52b and 52c (collectively, passageway 52) that branch from the upper block to the lower block in a manner that maintains independence of the passageways. Gas is provided to passageway 52 through port 64 and to passageway 54 through port 72. The passageways 52 and 54 are branched using manifolds 80 and 82 formed in middle block 60. Specifically, passageway 52 is branched through a manifold 80 and passageway 54 is branched through a manifold 82.

A coolant channel 84 is provided in the lower block 62 near the gas outlets 78 for cooling the gas outlets 78 to maintain the showerhead at a temperature below the liquification temperature of a process gas, e.g., below 40 degrees C for TDEAT.

The blocks 58, 60 and 62 are stacked upon one another and O-rings 90 are placed between the blocks 58, 60, and 62 in an attempt to seal the gas within the showerhead. Such O-rings 90 are effective in ensuring that the gas does not leak out of the showerhead but are ineffective in ensuring that the gases do not commingle within the showerhead by leaking between the gas passageways 52 and 54 at the interfaces of the various blocks. Such commingling defeats the purpose of the dual gas passageway assembly, i.e., the gases are not completely separated until they exit the lower block 62 into the process region. Additionally, the existence of O-rings within a process chamber leads to the possibility that the O-ring material will breakdown and contaminate the chamber and/or the wafer surface.

Therefore, there is a need in the art for a showerhead that provides at least two gases to the process region without commingling the gases prior to reaching the process region and without using O-rings to seal the gases into the showerhead.

SUMMARY OF THE INVENTION

The disadvantages associated with the prior art are overcome by the present invention of a faceplate for a showerhead of a semiconductor wafer processing system having a plurality of gas passageways to provide a plurality of gases to a process region without commingling those gases before they reach the process region within a reaction chamber.

The inventive showerhead contains a unitary faceplate and a gas distribution manifold assembly. To form the unitary faceplate, a pair of gas distribution plates (a lower plate and an upper plate) are coupled to one another and welded (fused) such that they form the unitary faceplate. The gases are carried to the various channels in the faceplate by a gas distribution manifold assembly that is bolted to the faceplate. Optionally, a cold plate can be bolted to the gas distribution manifold assembly to maintain the showerhead at a predefined temperature.

More specifically, the lower gas distribution plate of the faceplate contains a plurality of channels that form a manifold for a first process gas. The manifold channels contain a plurality of holes that allow the gas to escape from the faceplate into the process region. The lower gas distribution plate has a circular plan form with the gas distribution holes evenly distributed about the surface of the plate. The lower gas distribution plate also contains a plurality of distribution holes for the second process gas. However, these holes are not coupled to channels in the lower gas distribution plate, but are pass-through holes that extend through the lower gas distribution plate to gas holes in the upper gas distribution plate. The bottom surface of the upper gas distribution plate is coupled and fused to the top surface of the lower gas distribution plate such that the flat surfaces of the bottom of the upper gas distribution plate form a top surface of the manifold channels that carry the first gas. The manifold channels are all coupled to one another by a circumferential plenum that is located near the outer edge of the lower gas distribution plate.

A plurality of holes are drilled proximate the edge of the upper gas distribution plate into the circumferential plenum to provide gas to the circumferential plenum. The gas is coupled to the manifold channels that supply gas to the holes in the lower gas distribution plate.

The gas distribution manifold assembly is bolted to the back or top surface of the upper gas distribution plate. A large cavity in the manifold assembly covers the plurality of holes that pass through the upper gas distribution plate to the lower gas distribution plate. As such, gas is coupled through these holes to the lower gas distribution plate such that the second gas is supplied through the manifold and to the holes in the lower gas distribution plate. In this manner, one gas is supplied to the gas distribution manifold and couples through the various passageways to the process side of the showerhead, while the second gas is coupled to the circumferential plenum and provides gas to the manifold channels in the lower gas distribution plate.

To avoid the use of O-rings within the faceplate, the lower and upper gas distribution plates are fused by applying to the contacting surfaces a silicon-rich aluminum film or foil of 3 to 5 mils thickness, clamping the two gas distribution plates to one another, and then heating them to approximately 550° C. inside a vacuum chamber to fuse the aluminum in each gas distribution plates at locations where the plates contact one another. The fused surfaces must have a flatness of 1 to 3 mils to form an appropriate seal that maintains the separation of the gases as they transition from the upper gas distribution plate into the lower gas distribution plate.

BRIEF DESCRIPTION OF THE DRAWINGS

The teachings of the present invention can be readily understood by considering the following detailed description in conjunction with the accompanying drawings, in which:

FIG. 9 depicts a detailed cross sectional view of the assembled portions of the lower and upper gas distribution plates forming a faceplate for the showerhead of the present invention;

FIG. 13 depicts a cross sectional view of a portion of an alternative embodiment of a showerhead.

To facilitate understanding, identical reference numerals have been used, where possible, to designate identical elements that are common to the figures.

DETAILED DESCRIPTION

Figure 1:
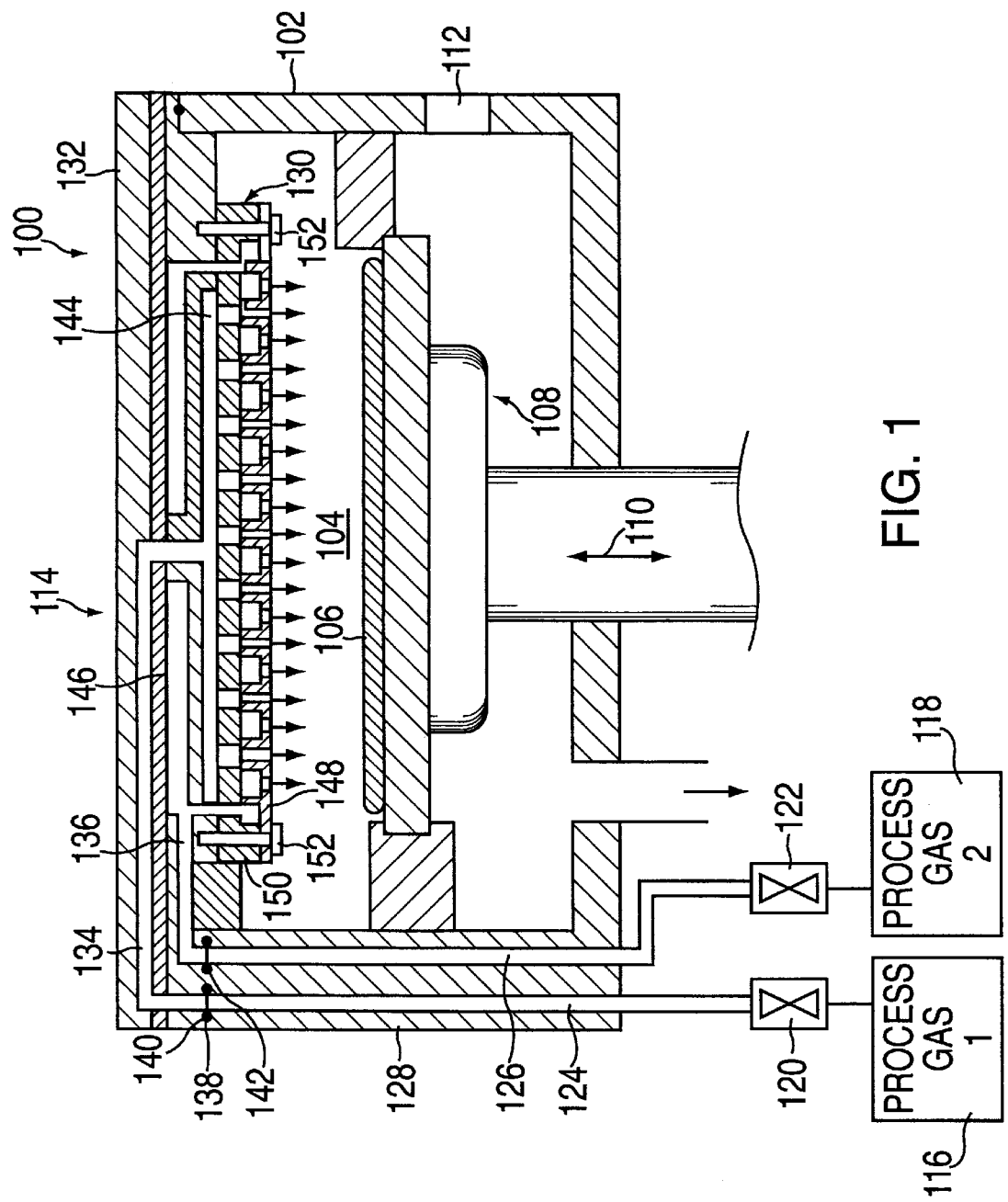
FIG. 1 depicts a cross sectional view schematically depicting a semiconductor wafer process reactor containing the showerhead of the present invention.

FIG. 1 depicts a cross-sectional schematic view of a semiconductor wafer processing reaction chamber, for example, a chemical vapor deposition reactor 100. The reactor 100 contains an enclosure 102 (also generally referred to as a chamber) defining a process region 104. A substrate 106, such as a semiconductor wafer, is maintained proximate the process region 104 upon a pedestal 108. The pedestal 108 moves vertically (as indicated by arrow 110) within the enclosure 102 to lower the pedestal to a position that allows the substrate 106 to be removed through a slit valve 112. While in the lowered position, a new substrate 106 positioned upon the pedestal 108. Thereafter, the pedestal 108 is raised into a process position, as shown, which places the wafer 106 proximate the process region 104. Process gases are supplied through the showerhead 114. In the preferred embodiment of the invention a plurality of gases are used to process the wafer, illustratively, two gases are used, process gas 1 (e.g., titanium tetrachloride $TiCl_4$) and process gas 2 (e.g., ammonia $NH_3$). These gases form a gaseous mixture that is required to process the wafer, i.e., form a deposit on the wafer or chemically etch the wafer. The process gases from respective sources 116 and 118 are respectively supplied through valves 120 and 122 to conduits 124 and 126 that run through the wall 128 of the enclosure 102 up to the shower head 114. The showerhead 114 forms the lid of the reactor 100.

The showerhead 114 has two main components, a faceplate 130 and a gas distribution manifold 132. The gas distribution manifold 132 has two conduits 134 and 136 that respectively couple to the conduits 124 and 126 that carry the gases through the chamber wall 128. The conduits at the interface 138 between the showerhead 114 and the wall 128 of the process chamber 102 are effectively sealed using O-rings 140 and 142 that circumscribe each conduit 124 and 126. The first process gas is provided via the conduit 134 to a cylindrical chamber 144 that distributes the first process gas to the faceplate 130. The second process gas is provided via conduit 136 to an annular chamber 146 that distributes the second process gas to the faceplate 130.

The faceplate 130 contains two components, a lower gas distribution plate 148 and a upper gas distribution plate 150. These two plates contain various channels and holes that define two distinct passageways for the two process gases to enter the process region 104. The specific arrangement of channels and holes are described in detail with respect to FIGS. 3, 4 and 5 for the lower gas distribution plate 148 and FIGS. 6, 7 and 8 for the upper gas distribution plate 150. To define the channels without using O-rings as seals between the channels and holes, the lower and upper gas distribution plates are fused to one another to form a unitary faceplate 130. The faceplate is bolted (using a plurality of bolts 152) to the gas distribution manifold 132. The mating surfaces of the faceplate 130 and the manifold 132 have a flatness of 1 to 3 mm and, as such, can be bolted without using O-rings and a sufficient seal is created to avoid gas commingling. The faceplate and manifold assembly are generally fabricated from a metal such as aluminum or nickel.

Figure 2:
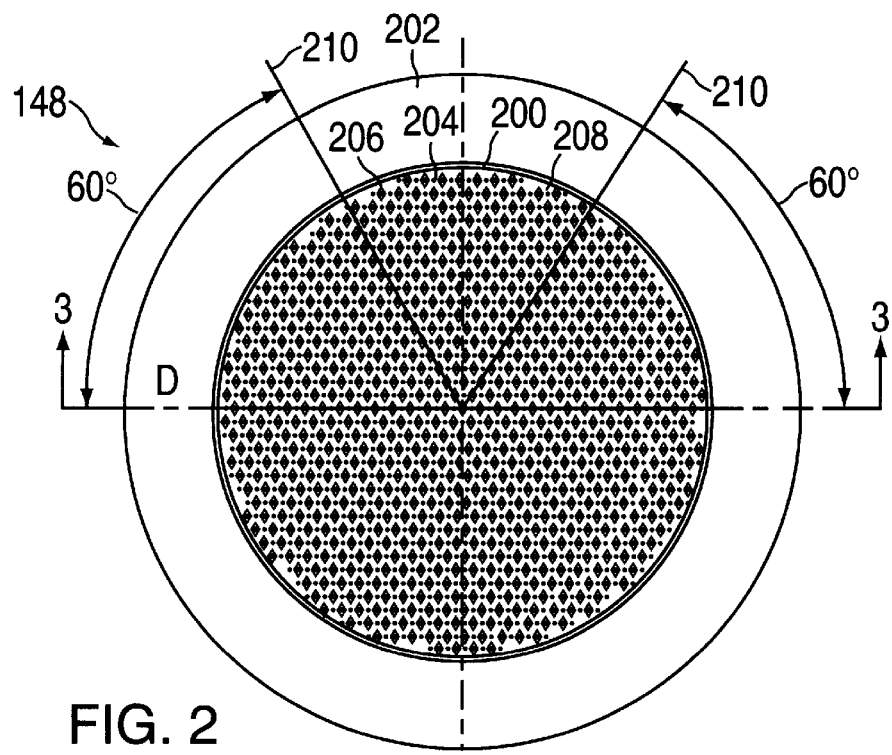
FIG. 2 depicts a top plan view of a lower gas distribution plate.
Figure 3:
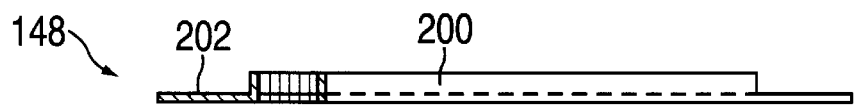
FIG. 3 depicts a partial cross sectional view of the lower gas distribution plate taken along lines 3—3 of FIG. 2.
Figure 5:
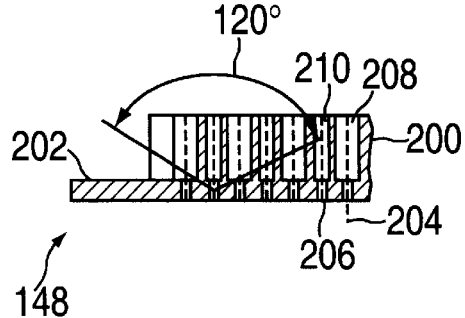
FIG. 5 depicts a cross sectional view of the detailed portion of the lower gas distribution plate taken along lines 5—5 in FIG. 4.
Figure 4:
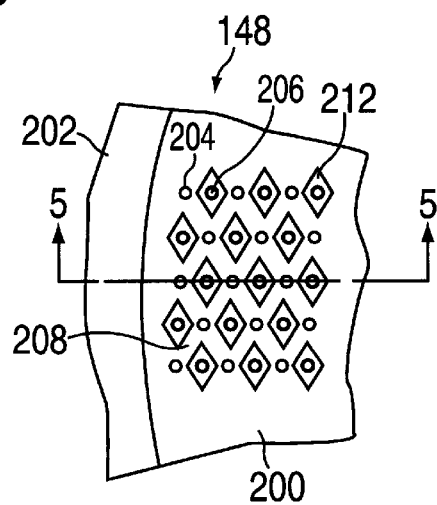
FIG. 4 depicts detailed top plan view of one portion of the lower gas distribution plate.

FIG. 2 depicts a top plan view of the lower gas distribution plate 148; FIG. 3 depicts a partial cross sectional view of the lower gas distribution plate 148 taken along line 3—3 in FIG. 2; FIG. 4 depicts a detailed top plan view of a portion of the lower gas distribution plate 148 depicted in FIG. 2; and FIG. 5 depicts a detailed cross-sectional view taken along lines 5—5 in FIG. 4. To best understand the disclosure of the lower gas distribution plate the reader should simultaneously refer to FIGS. 2, 3, 4 and 5.

More specifically, the lower gas distribution plate 148 is circular or disc-like in plan form having a central portal region 200 and a circumferential flange 202 where the flange 202 has a thickness of approximately 2.5 mm and the central portal region 200 has a thickness of approximately 1.21 cm. The central region 200 is defined by the width of the flange 202 which is approximately 2.54 cm. The central portal region 200 contains two sets of holes 204 and 206 where each hole has a center-to-center spacing of approximately 6.35 mm from a neighboring hole. Generally, holes 206 for the first gas (e.g. holes for $TiCl_4$ are 0.025 inches) are approximately the same size as the holes 204 for the second gas (e.g., holes for $NH_3$). However, the choice of hole size for each gas is purely a process condition. As such, hole size will vary depending upon gas flow rate, gas pressure, gas type, chamber pressure and the like. The hole size may also vary across the faceplate surface such that gas flow rates through the holes are correlated with the location of the hole in the faceplate.

The central portal region 200 is cut with grooves or channels 208 having a width of 3.173 mm and a depth of 9.525 mm. They are cut at an angle of 60° from the horizontal (as shown by lines 210). As such, a plurality of interconnecting channels 208 are formed over the holes 204 for the second gas. The holes 206 for the first gas extend through the portal region 200 and are counterbored with bores 210. The junction of the bore 210 and the hole 206 is angled at, for example, 120°. The channels 208 interconnect in a "criss-cross" pattern and, when enclosed at the open top thereof, form a gas manifold for the second gas. There are approximately 700 holes 204 and 206 for each of the gases to exit the lower gas distribution plate 148.

Figure 6:
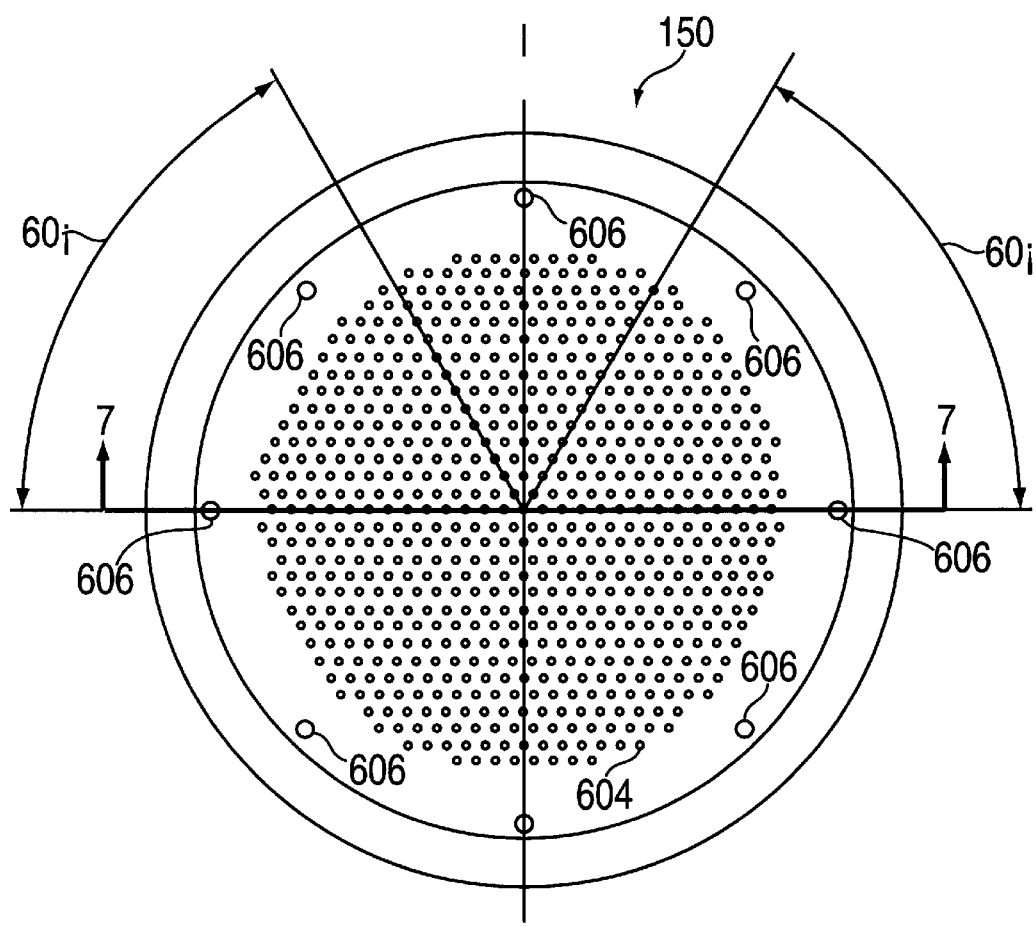
FIG. 6 depicts a top plan view of a upper gas distribution plate.
Figure 7:
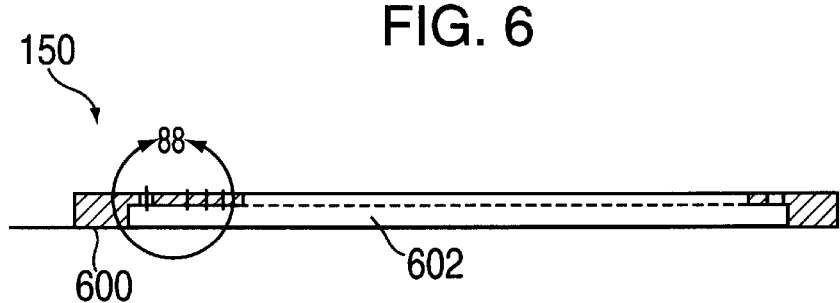
FIG. 7 depicts a partial cross sectional view of the upper gas distribution plate taken along lines 7—7 of FIG. 6.
Figure 8:
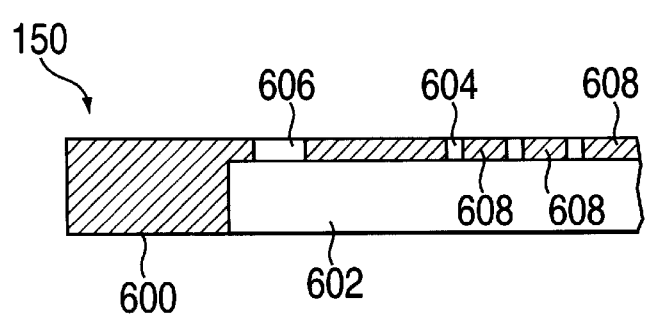
FIG. 8 depicts a detailed cross sectional view of a portion of the upper gas distribution plate taken along line 8—8 of FIG. 7.

FIGS. 6, 7 and 8 respectively depict a top plan view of the upper gas distribution plate 150 a cross sectional view of the plate 150 taken along line 7—7 in FIG. 6, and a detailed cross sectional view of a portion of the plate 150 taken along line 8—8 of FIG. 7. The upper gas distribution plate 150 has an outer edge (flange support 600) that, when assembled, interfaces and rests upon the flange 202 of the lower gas distribution plate 148. Central to the upper gas distribution plate 150 is a recessed portion 602 that substantially matches the raised central portal region 200 of the lower gas distribution plate 148 such that the second and lower gas distribution plates interfit. The upper gas distribution plate 150 contains a plurality of centrally located holes 604 having a diameter of approximately 1.6 mm and these holes align with the bores 210 for the first gas in the lower gas distribution plate 148. In addition, proximate the edge of the upper gas distribution plate 150, but inward of the flange support 600, are a plurality of holes 606 that are used to distribute gas to the channels 208 in the lower gas distribution plate 148. Upon assembly, the flat portions 608 of the upper gas distribution plate 150 between the gas distribution holes 604 form a top of the channels 208 in the lower gas distribution plate 148. There are approximately 700 holes in the upper gas distribution plate 150 which match identically to the arrangement of the first gas holes 206 and their associated counterbores 210 in the lower gas distribution plate 148. The gas distribution holes 606 that provide gas to the channels 208 in the lower gas distribution plate 148 are arranged at 45° angles with respect to one another about the periphery of the upper gas distribution plate 150 such that there are 8 holes, each having a diameter of approximately 6.35 mm.

FIG. 9 depicts an assembled view of a portion of the lower and upper gas distribution plates 148 and 150. To assemble the faceplate 130, the surfaces of the lower and upper gas distribution plates 148, 150 have to be uniform to within 1 to 3 mm. To fuse aluminum distribution plates, the mating surfaces are then coated with silicon-rich aluminum, the lower and upper distribution plates 148, 150 are clamped to one another and then the assembly is placed into a furnace where the lower and upper gas distribution plates fuse to one another to form one single element, the faceplate 130. As such, no O-rings are necessary to retain the gas within the faceplate or to maintain separation of the gases. The plates 148 and 150 fuse at the junction of the flange 202 and flange support 600 and at the surfaces 608 to the tops of the diamond-shaped islands 212. Specifically, the flange 202 and the flange support 600 fuse at the outer edge 902 forming a sufficient seal to maintain all of the gases inside the faceplate. Additionally, the upper gas distribution plate 150 and the flange 202 of the lower gas distribution plate 148 form a circumferential plenum 900 that provides gas to the gas channels 208 formed in the lower gas distribution plate 148. The holes 606 provide gas to this circumferential plenum 900. The upper gas distribution plate 150 forms the tops of the channels 208 such that uniform rectangular cross section channels 208 are formed to distribute the second process gas to the holes 204 in the lower gas distribution plate 148. The holes 604 in the upper gas distribution plate 150 are aligned with the holes 210 in the lower gas distribution plate 148 to allow the first process gas to pass through both distribution plates 148 and 150 unimpeded to reach the process region of the reactor chamber. Once fused, a plurality of mounting bores 904 (that are countersunk to enable the bolt heads (not shown) to remain flush with the faceplate surface) are formed in the circumferential edge region 902 to facilitate affixing the faceplate 130 to the gas distribution manifold 132.

If the faceplate is fabricated of a material that reacts with a chamber process gas, the faceplate is generally plated with a protective material to avoid corrosion of the faceplate. For an aluminum faceplate that is intended to be exposed to chlorine, the faceplate is plated with nickel to a depth of 0.2 to 0.4 mils. For maximum protection, the faceplate should be plated on the inside and outside surfaces.

Figure 10:
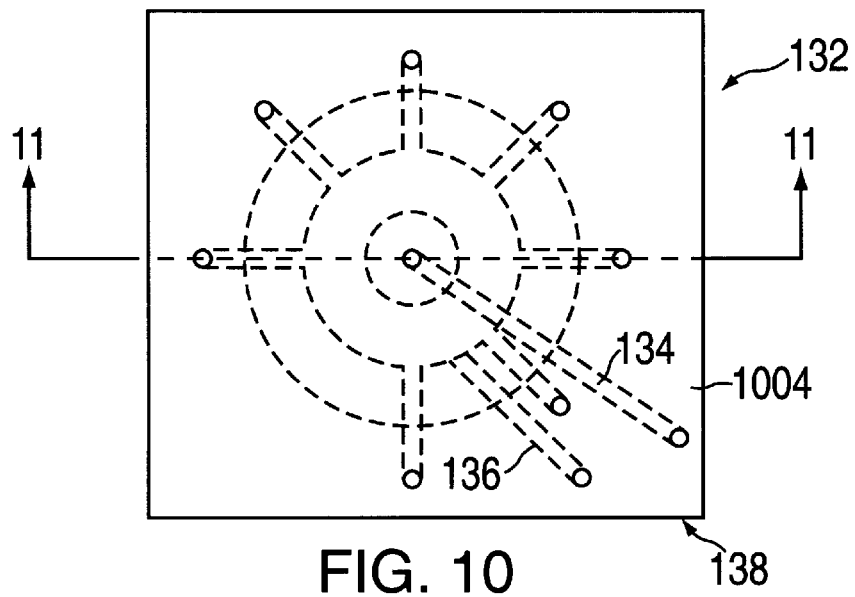
FIG. 10 depicts a top plan view of a gas distribution manifold assembly.
Figure 11:
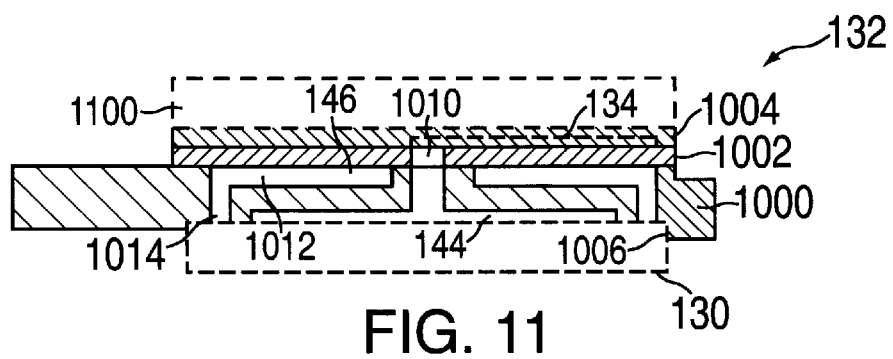
FIG. 11 depicts a cross sectional view of the gas distribution manifold assembly taken along line 11—11 of FIG. 10.
Figure 12:
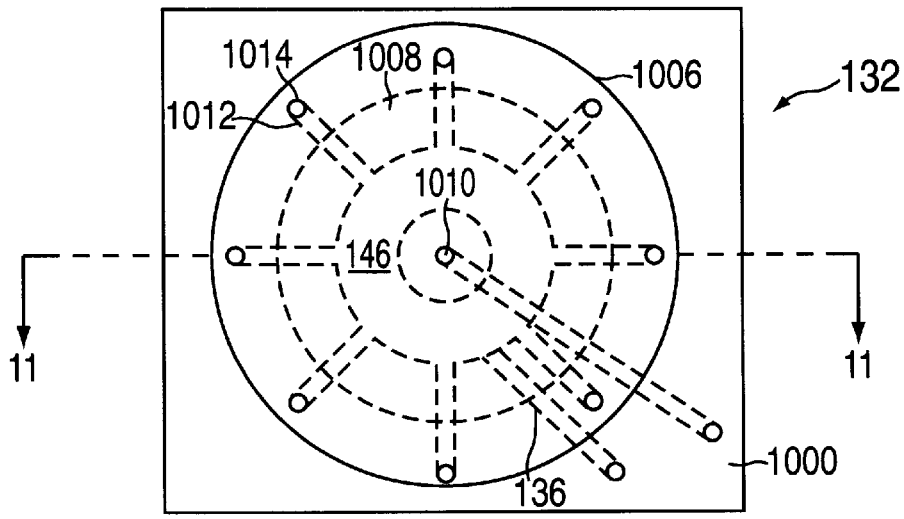
FIG. 12 depicts a bottom plan view of the gas distribution manifold assembly.
Figure 14:
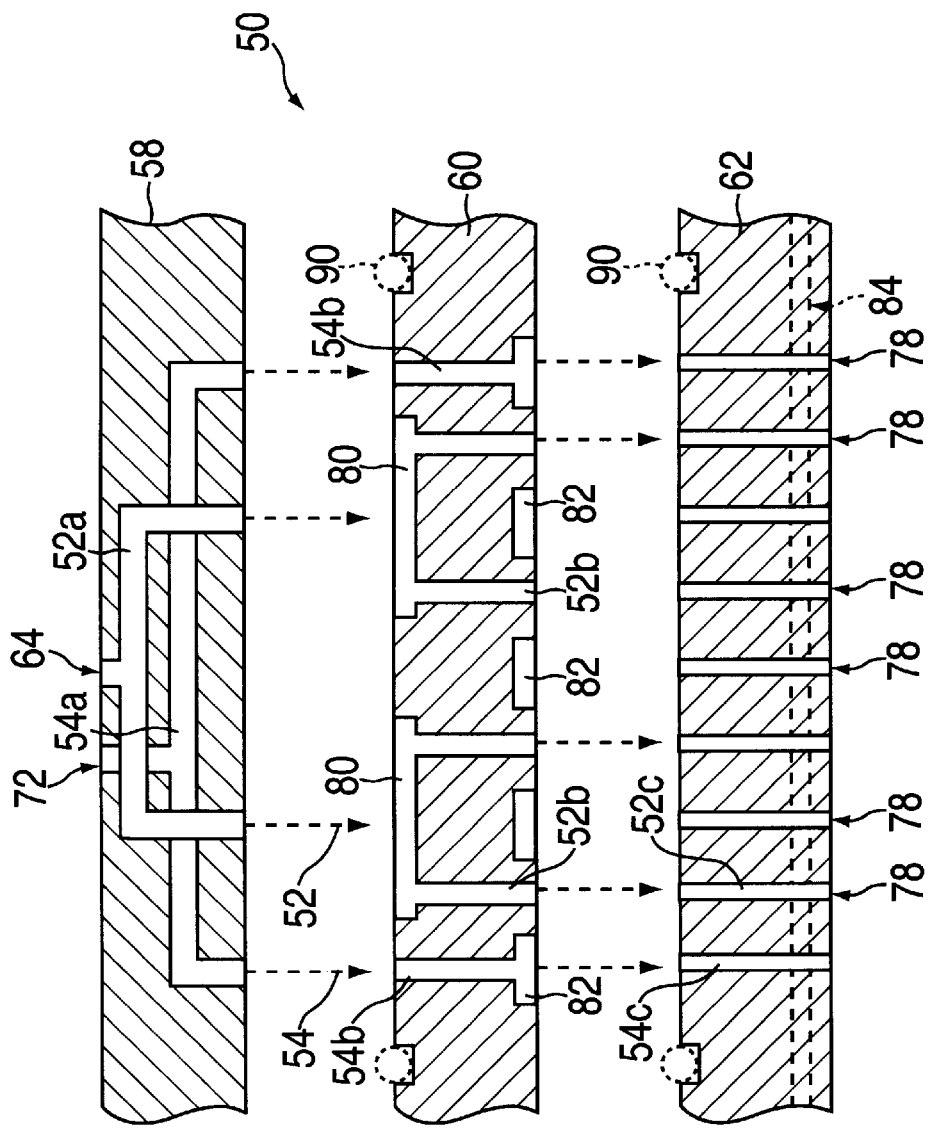
FIG. 14 depicts a cross sectional exploded view of a prior art dual gas showerhead.

FIGS. 10, 11 and 12 respectively depict a top plan view of the gas distribution manifold 132, a cross-sectional view of the gas distribution manifold 132 taken along lines 11—11 of FIG. 10, and a bottom plan view of the gas distribution manifold 132. The gas distribution manifold 132 supplies each of the process gases from the conduits 124 and 126 depicted in FIG. 1 to the faceplate 130. The manifold 132 comprises three components; a lower plate 1000, a middle plate 1002 and a top plate 1004. The bottom plate 1000 contains a first cylindrical cavity having a diameter substantially the same as the diameter of the faceplate 130. The cavity 1006 is defined to interfit with the faceplate 130. A second cavity 1008 is coaxial with the first cavity but has a smaller diameter such that when the faceplate 130 abuts the manifold 132 by mounting in the cavity 1006 the chamber 144 is formed. This chamber is used to distribute the first process gas to the holes 604 in the upper gas distribution plate 150. A centrally located bore 1010 couples the chamber 144 to a conduit 134 that extends from the central bore to a location near the edge of the upper plate 1004. At that location, the conduit 134 couples to the conduit 124 in the chamber wall. To form conduit 134 the upper plate 1004 has a channel milled into the bottom surface thereof through which gas will flow. The channel is completed by mounting the upper plate 1004 to the middle plate 1002 such that the top surface of the middle plate forms the bottom of the channel 134.

To couple the second process gas from the conduit 126 and the wall of the chamber to the faceplate, an annular channel 146 is defined in the manifold 132. The annular chamber is formed by milling an annular channel 146 in the top surface of the lower plate 1000. Radially directed channels 1012 connect the annular channel 146 to a bore 1014 at the distal end of each channel 1012. Additionally, a channel that forms conduit 136 is formed in the lower plate 1000 extending from the annular channel 146 to the conduit coupling location at interface 138. The top of the annular channel 146 is closed by middle plate 1002 such that a closed annular channel 146 is formed with radially extending channels 1012 and bores 1014 that couple the second process gas to the distribution plenum 900 in the faceplate 130.

To fabricate the gas distribution manifold assembly 132 the lower, middle and upper plates 1000, 1002, and 1004 have their mating surfaces coated with a silicon-rich aluminum film, the entire assembly is clamped and placed in a furnace at a temperature of approximately 550° C. to fuse the contacting surfaces to one another and form a unitary manifold assembly 132. As such, no O-rings are necessary to maintain a separation between the process gases.

The manifold assembly and faceplate that form the showerhead are fabricated of aluminum or some other thermally conductive material such as nickel. As such the showerhead can be coupled to a cold plate or other cooling apparatus that will maintain the entire showerhead at a uniform and constant temperature. Such a cold plate could easily be formed using an aluminum body having cooling channels cut or otherwise formed therein such that a coolant could be circulated through the cooling plate while the cooling plate is mounted to a top of the manifold 132. An illustrative placement of a cold plate 1100 mounted to the top of the manifold assembly 132 is shown in FIG. 11.

The showerhead of the foregoing embodiment of the invention has been tested in a $10^{-5}$ torr vacuum test and no cross talk has been experienced between the gases provided to each of the gas input conduits 134 and 136.

FIG. 13 depicts a cross sectional view of a portion of an alternative embodiment of a faceplate 1300. This embodiment contains an upper gas distribution plate 1302 and a lower gas distribution plate 1304. The lower gas distribution plate 1304 is similar to the previously described lower gas distribution plate (148 of FIG. 9) in that the plate 1304 defines a plurality of gas distribution holes (one set of holes 1306 is for distributing a first gas and one set of holes 1308 is for distributing a second gas). Every other hole is counterbored from the upper side 1310 of the lower plate 1304. In each counterbore is located one end of a vertically oriented tubular conduit (tubes) 1312. The other end of each tube 1312 passes through a hole 1320 in the upper gas distribution plate 1302. The upper and lower gas distribution plates 1302 and 1304 and the tubes 1312 are fabricated of a metal such as nickel or aluminum. Once assembled, the faceplate is placed in a furnace and heated to braze (fuse) the contacting surfaces to one another in a similar manner as the previous embodiment was fabricated.

As with the previous embodiment, if the faceplate is fabricated of a material that reacts with a chamber process gas, the faceplate is generally plated with a protective material to avoid corrosion of the faceplate. For an aluminum faceplate that is intended to be exposed to chlorine, the faceplate is plated with nickel to a depth of 0.2 to 0.4 mils. For maximum protection, the faceplate should be plated on the inside and outside surfaces.

Each of the tubes 1312 defines a gas passage for the second gas to reach the gas distribution holes 1308. The lower surface 1314 of the upper gas distribution plate 1302 and the upper surface 1310 of the lower gas distribution plate 1304 define a cavity 1316 that distributes the first gas to the gas distribution holes 1306. The first gas is supplied to the cavity 1316 via one or more portals 1318. A gas manifold (not shown, but identical to the manifold 132 of FIG. 1) is coupled to the faceplate 1300 and supplies the first gas to the tubes 1312 and the second gas to the portals 1318 in the faceplate 1300. Mounting and operation of a showerhead containing this embodiment of the faceplate is identical to the previous embodiment.

An alternative manufacturing process for either embodiment of the invention involves stacking die-cut layers (each layer being approximately 5 mils thick) to "build up" the faceplate structure. The stack or laminate of layers is then placed in a furnace and fused into a unitary faceplate. The material of the faceplate is a metal such as nickel or aluminum.

Although various embodiments which incorporate the teachings of the present invention have been shown and described in detail herein, those skilled in the art can readily devise many other varied embodiments that still incorporate these teachings.

What is claimed is:

1. A faceplate for a showerhead comprising:
a lower gas distribution plate and an upper gas distribution plate, where said lower gas distribution plate and said upper gas distribution plate comprise a plurality of first gas holes that extend through both the lower gas distribution plate and the upper gas distribution plate, a plurality of second gas holes that extend through the lower gas distribution plate into a plurality of interconnecting channels, the interconnecting channels are coupled to a circumferential plenum, each of the plurality of first gas holes are sealed by a fused joint relative to each of the plurality of interconnecting channels.

2. The faceplate of claim 1 wherein the interconnecting channels in the lower gas distribution plate are formed in a criss-cross pattern.

3. The faceplate of claim 1 wherein each of the first gas holes are at least partially defined by a tube.

4. The faceplate of claim 1 wherein the faceplate is formed by fusing said first gas distribution plate to said second gas distribution plate.

5. A showerhead for a semiconductor wafer processing system comprising:

a faceplate having a unitary construction, where a plurality of first gas holes extend through the faceplate and the faceplate has an internal gas distribution cavity defined by a plurality of interconnecting channels, each of the plurality of first gas holes are sealed by a fused joint relative to each of the plurality of interconnecting channels, the interconnecting channels are coupled to a circumferential plenum that is connected to second gas holes formed in said upper gas distribution plate; and a gas distribution manifold assembly, coupled to said faceplate, for supplying a first gas to the first gas holes in said upper gas distribution plate and a second gas to the second gas holes in said upper gas distribution plate.

6. The showerhead of claim 5 wherein a cold plate is affixed to said gas distribution manifold assembly.

7. The showerhead of claim 5 wherein the interconnecting channels in the lower gas distribution plate are formed in a criss-cross pattern.

8. The showerhead of claim 5 wherein each of the first gas holes are at least partially defined by a tube.

9. The showerhead of claim 5 wherein the faceplate is formed by fusing a first gas distribution plate to a second gas distribution plate.

10. The showerhead of claim 5 wherein the gas distribution manifold further comprises a first gas channel that has a cylindrical form that supplies the first gas to the plurality of first gas holes in said upper gas distribution plate.

11. The showerhead of claim 5 wherein the gas distribution manifold further comprises a second gas channel that has an annular cavity and radial channels extending from the annular cavity that supply the second gas to the circumferential plenum.

12. A showerhead for a semiconductor wafer processing system comprising:

a faceplate having a lower gas distribution plate and an upper gas distribution plate, where a plurality of first gas holes extend through both the lower gas distribution plate and said upper gas distribution plate and a plurality of second gas holes the extend through the lower gas distribution plate into a plurality of interconnecting channels, each of the plurality of first gas holes are sealed by a fused joint relative to each of the plurality of interconnecting channels, the interconnecting channels are coupled to a circumferential plenum that is connected to third gas holes that extend through said upper gas distribution plate; and a gas distribution manifold assembly, coupled to said faceplate, for supplying a first gas to the first gas holes in said upper gas distribution plate and a second gas to the third gas holes in said upper gas distribution plate.

13. The showerhead of claim 12 wherein a cold plate is affixed to said gas distribution manifold assembly.

14. The showerhead of claim 12 wherein the interconnecting channels in the lower gas distribution plate are formed in a criss-cross pattern.

15. The showerhead of claim 12 wherein each of the first gas holes are at least partially defined by a tube.

16. The showerhead of claim 12 wherein the faceplate is formed by fusing the first gas distribution plate to the second gas distribution plate.

17. The showerhead of claim 12 wherein the gas distribution manifold further comprises a first gas channel that has a cylindrical form that supplies the first gas to the plurality of first gas holes in said upper gas distribution plate.

18. The showerhead of claim 12 wherein the gas distribution manifold further comprises a second gas channel that has an annular cavity and radial channels extending from the annular cavity that supply the second gas to the circumferential plenum.

19. A chemical vapor deposition reactor comprising:

a vacuum chamber defining a deposition region;

a wafer support pedestal, positioned within said vacuum chamber and proximate said deposition region;

a showerhead, positioned within said vacuum chamber and proximate said deposition region, where said showerhead comprises a faceplate having a lower gas distribution plate and an upper gas distribution plate, where said lower gas distribution plate and said upper gas distribution plate comprise a plurality of first gas holes that extend through the lower gas distribution plate and said upper gas distribution plate and a plurality of second gas holes the extend through the lower gas distribution plate into a plurality of interconnecting channels, each of the plurality of first gas holes are sealed by a fused joint relative to each of the plurality of interconnecting channels, the interconnecting channels are coupled to a circumferential plenum that connects to third gas holes in said upper gas distribution plate; and a gas distribution manifold assembly, coupled to said faceplate, for supplying a first gas to the first gas holes in said upper gas distribution plate and a second gas to the third gas holes in said upper gas distribution plate.

20. The chemical vapor deposition reactor of claim 19 where said first gas is titanium tetrachloride and said second gas is ammonia.

* * * * *